US008299687B2

(12) United States Patent
Spigelmyer et al.

(10) Patent No.: US 8,299,687 B2
(45) Date of Patent: Oct. 30, 2012

(54) ULTRASONIC ARRAY TRANSDUCER, ASSOCIATED CIRCUIT AND METHOD OF MAKING THE SAME

(75) Inventors: Matthew Todd Spigelmyer, Spring Mills, PA (US); Derek Ryan Greenaway, Howard, PA (US)

(73) Assignee: Transducerworks, LLC, Howard, PA (US)

( * ) Notice: Subject to any disclaimer, the term of this patent is extended or adjusted under 35 U.S.C. 154(b) by 168 days.

(21) Appl. No.: 12/841,165

(22) Filed: Jul. 21, 2010

(65) Prior Publication Data

US 2012/0019106 A1   Jan. 26, 2012

(51) Int. Cl.
*H01L 41/053* (2006.01)
(52) U.S. Cl. .................. 310/348; 310/365; 310/366
(58) Field of Classification Search ................. 310/322, 310/348, 365, 366
See application file for complete search history.

(56) References Cited

U.S. PATENT DOCUMENTS

| 5,267,221 A | 11/1993 | Miller et al. |
| 5,329,496 A | 7/1994 | Smith |
| 5,381,385 A | 1/1995 | Greenstein |
| 5,493,541 A | 2/1996 | Snyder |
| 5,592,730 A | 1/1997 | Greenstein et al. |
| 5,644,085 A | 7/1997 | Lorraine et al. |
| 5,648,942 A | 7/1997 | Kunkel, III |
| 5,655,538 A | 8/1997 | Lorraine et al. |
| 5,774,960 A | 7/1998 | De Fraguier et al. |
| 5,852,860 A | 12/1998 | Lorraine et al. |
| 5,906,580 A | 5/1999 | Kline-Schoder et al. |
| 6,043,590 A | 3/2000 | Gilmore |
| 6,266,857 B1 | 7/2001 | Corbett, III et al. |
| 6,483,225 B1 | 11/2002 | Spigelmyer |
| 6,489,706 B2 | 12/2002 | Sliwa, Jr. et al. |
| 6,656,124 B2 | 12/2003 | Flesch et al. |
| 6,747,400 B2 | 6/2004 | Maichl et al. |
| 6,791,240 B2 | 9/2004 | Mauchamp et al. |
| 7,148,607 B2 | 12/2006 | Sato |
| 7,275,298 B2 | 10/2007 | Schindel |
| 7,316,059 B2 | 1/2008 | Sato |

(Continued)

FOREIGN PATENT DOCUMENTS

EP   1810619 A1   7/2007
(Continued)

OTHER PUBLICATIONS

International Search for PCT/US2011/044818 dated Dec. 29, 2011 (4 pgs).

*Primary Examiner* — Walter Benson
*Assistant Examiner* — Bryan Gordon
(74) *Attorney, Agent, or Firm* — J Clinton Wimbish; Smith Moore Leatherwood LLP

(57) ABSTRACT

A transducer system includes a multi-layer flexible circuit. The flexible circuit includes a first layer, a second layer and a third layer. The circuit engages a piezoelectric material/electrode subassembly. Vias are used to operatively connect ground electrodes of individual transducer elements to grounds in the third layer of the circuit. The vias extend through the first and second layers to the third layer of the circuit. When the flexible circuit is diced during the assembly of the transducer system, no cuts are made in the third layer of the circuit. As a result, a common ground connection is maintained by way of the grounds in the third layer of the circuit. Thus, no subsequent operation of reconnecting the common ground electrode is required.

9 Claims, 6 Drawing Sheets

U.S. PATENT DOCUMENTS

| | | | |
|---|---|---|---|
| 7,378,776 B2 * | 5/2008 | Lu | 310/322 |
| 7,446,458 B2 | 11/2008 | Sasaki et al. | |
| 7,808,162 B2 * | 10/2010 | Maruyama et al. | 310/364 |
| 7,872,949 B2 | 1/2011 | Osawa | |
| 7,877,854 B2 | 2/2011 | Sliwa et al. | |
| 2001/0015592 A1 | 8/2001 | Sliwa, Jr. et al. | |
| 2009/0001853 A1 | 1/2009 | Adachi et al. | |
| 2009/0122651 A1 * | 5/2009 | Kupnik et al. | 367/181 |
| 2011/0071396 A1 * | 3/2011 | Sano et al. | 600/443 |

FOREIGN PATENT DOCUMENTS

| | | |
|---|---|---|
| WO | 03035281 A2 | 5/2003 |
| WO | 2009139400 A1 | 11/2009 |

* cited by examiner

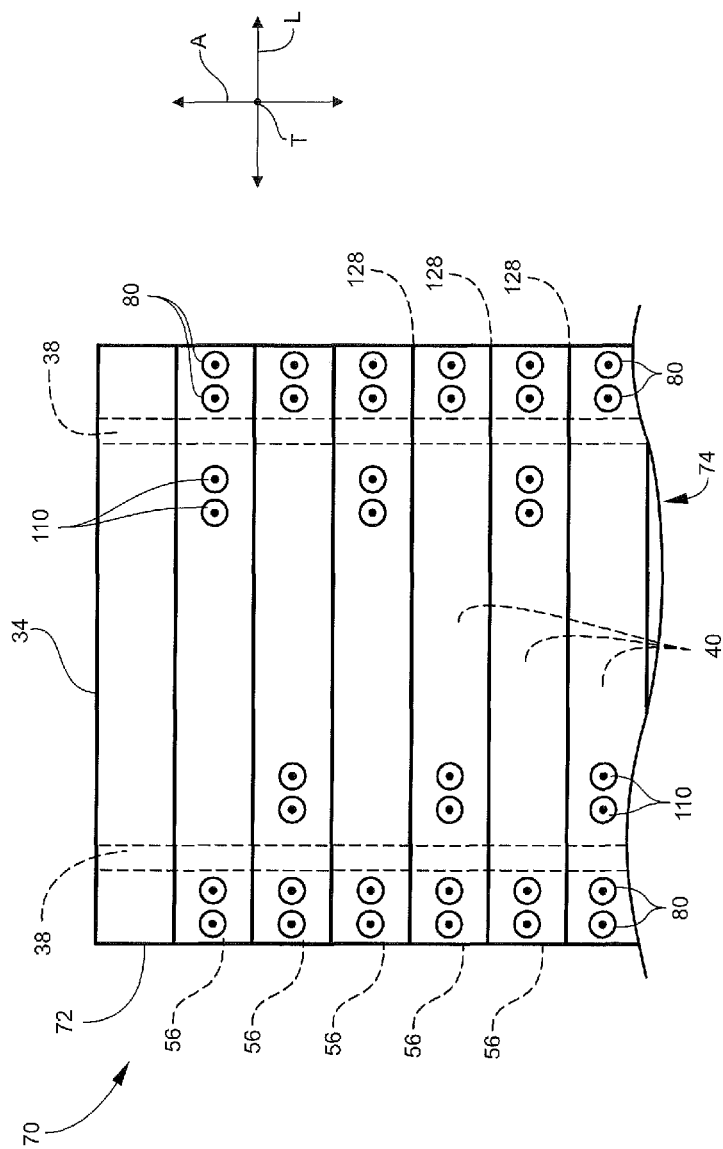

ULTRASONIC ARRAY TRANSDUCER, ASSOCIATED CIRCUIT AND METHOD OF MAKING THE SAME

FIELD

Embodiments relate in general to transducers and, more particularly, to ultrasonic array transducers.

BACKGROUND

Ultrasonic transducers comprise a plurality of transducer elements that are used to transmit and receive ultrasonic energy to generate an image of a target. Each transducer element operates as an independent point source. Generally, the greater the quantity of transducer elements, the greater the quality of the image.

There are a number of ways in which an ultrasonic transducer can be made. One manufacturing approach will be described in connection with FIG. 1. A monolithic block of piezoelectric ceramic material 10 is provided. A portion of the piezoelectric material 10 is covered by a plating material 12 wrapped therearound. Deactivation cuts 14 are made along a top surface of the plating material 12 to define a positive electrode 16 and a ground electrode 18. The deactivation cuts 14 extend into and out of the page in FIG. 1. The positive electrode 16 is formed by that portion of the plating material 12 located between the two deactivation cuts 14. The ground electrode 18 is formed by the plating material 12 outside of the two deactivation cuts 14. With the use of a wrap around plating material 12, electrical connections to the positive and ground electrodes 16, 18 can be easily made on the same surface of the piezoelectric material 10. The block of piezoelectric ceramic material 10 and the plating material 12 with the deactivation cuts 14 form a piezoelectric material/electrode assembly 24.

A flexible circuit 22 is disposed on the top of the piezoelectric material/electrode assembly 24. Electrical connections are made between individual traces of the flexible circuit 22 and the positive and ground electrodes 16, 18 in locations of each intended transducer element. For instance, wires can be soldered onto the positive and ground electrodes 16, 18 and attached to individual traces of the flexible circuit 22. A solid backer 26 is bonded to the top side of the piezoelectric material/electrode assembly 24 with the flexible circuit 22 sandwiched therebetween. One or more matching layers 28 are then attached to the bottom side of the piezoelectric material/electrode assembly 24.

A plurality of individual transducer elements are formed using a dicing saw 30 to make a plurality of parallel dices or cuts in the assembly. The dicing saw 30 is brought into contact with the assembly from the patient side of the assembly, that is, from the matching layer 28 side of the assembly. Thus, the dicing saw 30 cuts through the one or more matching layers 28, through the plating material 12, through the piezoelectric material 10, through the flexible circuit 22 and into a portion of the backer 26. A plurality of transducer elements are developed by the dicing operation. The cuts formed by the dicing saw 30 can extend in a direction that is perpendicular to the direction in which the deactivation cuts 14 extend.

The undiced portion of the backer 26 holds the diced assembly together. After the dicing operation, kerf filler can be placed in the cuts to provide structural support to the diced assembly. The kerf filler can also provide some degree of acoustic isolation between the transducer elements.

However, when dices are made in the assembly, the common ground electrode 18 is severed, and a plurality of individual ground electrodes is formed. The individual ground electrodes must be reconnected. Typically, a wire is soldered across the individual ground electrodes to reconnect the ground electrodes. This process is labor intensive and time consuming. Further, the heat from the soldering process can depolarize the piezoelectric material 10, thereby adversely affecting the performance of the transducer.

Thus, there is a need for a system and method that can minimize such concerns.

SUMMARY

In one respect, embodiments are directed to a circuit for a transducer assembly. In one embodiment, the circuit can be a flexible circuit. The circuit includes a first layer, a second layer and a third layer. A first ground and a second ground are provided in the third layer.

The circuit also includes a plurality of first vias. Each first via has a first end and a second end. The second end of each first via is operatively connected to a respective one of the first and second grounds. The plurality of first vias extend from the first and second grounds such that the first vias pass through the first and second layers. The first end of each first via is at least partially exposed to outside the circuit. The first vias can be provided in pairs.

The circuit can further include a ground via. The ground via can be operatively connected at one end to either the first ground or the second ground. The ground via can extending therefrom to the second layer. A conductor operatively can be connected to the other end of the ground via.

In one embodiment, the circuit can further include a plurality of second vias. Each second via can have a first end and a second end. The first end of each first via can be at least partially exposed to the exterior of the circuit. The second end of each first via can be located within the second layer. The plurality of second vias can be located inboard on the plurality of first vias. The plurality of second vias can be arranged in a staggered manner. Alternatively, the plurality of second vias can be provided in pairs. A plurality of conductors can be provided. Each of the conductors can be operatively connected to a respective one of the second ends of the second vias.

In a second respect, embodiments of the invention are directed to an ultrasonic transducer system. The system includes a plurality of piezoelectric elements that are partially covered by a plating material wrapped around each piezoelectric element. A pair of elongated parallel deactivation cuts is formed in a surface of the plating material so as to define a positive electrode and a ground electrode.

The system includes a circuit, which can be, for example, a flexible circuit. The circuit has a first layer, a second layer, and a third layer, a first ground and a second ground being provided in the third layer, and a plurality of first vias. Each first via has a first end and a second end. The second end of each first via is operatively connected to a respective one of the first and second grounds. Each of the first vias extends from one of the first and second ground such that it passes through the first and second layers. The first end of each first via is operatively connected to the ground electrode of a respective one of the plurality of piezoelectric elements. In one embodiment, the first vias can be provided in pairs.

The system can further include a ground via. The ground via can be operatively connected at one end to one of the first ground or the second ground. The ground via can extend from the respective ground to the second layer. A conductor can be operatively connected to the ground via.

The system can include a plurality of second vias. Each second via can have a first end and a second end. The first end of each second via can be operatively connected to the positive electrode of a respective one of the plurality of piezoelectric elements. The second end of each second via can be located within the second layer. The plurality of second vias can be located inboard on the plurality of first vias. The plurality of second vias can be arranged in a staggered manner. The plurality of second vias can be provided in pairs.

The system can include a plurality of conductors. Each conductor can be operatively connected to a respective one of the second ends of the second vias.

In a third respect, embodiments of the invention are directed to a method of forming a transducer assembly. The method includes the step of providing a piezoelectric element partially covered by a plating material wrapped around the piezoelectric element. Two elongated parallel deactivation cuts are formed in a surface of the plating material so as to define a positive electrode and a ground electrode.

The method further includes the step of providing a circuit. The circuit has a first layer, a second layer, and a third layer. A first ground and a second ground are provided in the third layer. The circuit also includes a plurality of first vias. Each first via has a first end and a second end. The second end of each first via is operatively connected to a respective one of the first and second grounds. Each of the first vias extend from a respective one of the first and second grounds such that each first via passes through the first and second layers.

According to the method, the first end of each first via is operatively connected to the ground electrode of a respective one of the plurality of piezoelectric elements.

In one embodiment, the method can also include the step of forming a plurality of elongated cuts in the piezoelectric element, the plating material and the circuit such that the cuts penetrate the first and second layers of the circuit but do not penetrate the third layer of the circuit. As a result, a plurality of transducer elements can be formed and a plurality of ground electrodes can be formed. The plurality of ground electrodes can remain operatively connected by the first and second grounds in the third layer of the circuit. Each of the ground electrodes can be operatively connected to one of the first and second grounds by a respective one of the first vias.

BRIEF DESCRIPTION OF THE DRAWINGS

FIG. 6 is a top plan cross-sectional of a first layer of an embodiment of a circuit, showing an arrangement in which vias are provided in pairs.

DETAILED DESCRIPTION

Figure 1:
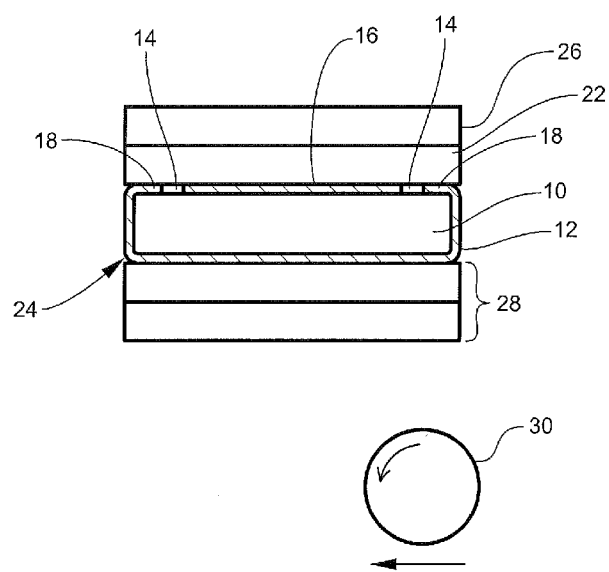
FIG. 1 is a side elevation cross-sectional view of a known transducer system.

Embodiments are directed to a transducer system, an associated circuit and an associated manner of making the transducer. Aspects will be explained in connection with one possible system and method, but the detailed description is intended only as exemplary. Embodiments are shown in FIGS. 2-6, but the embodiments are not limited to the illustrated structure or application. It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details.

Figure 2:
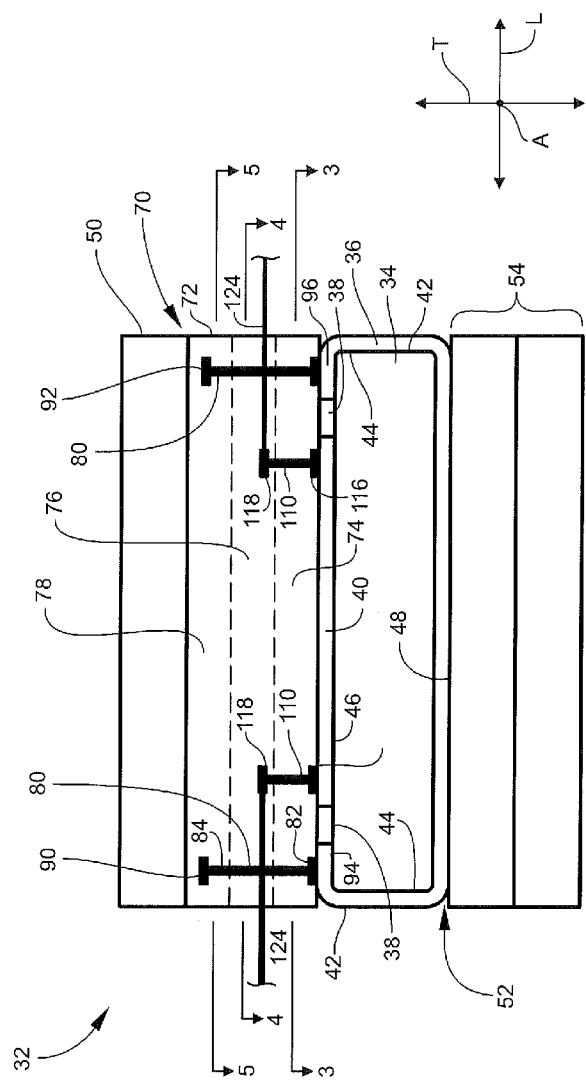
FIG. 2 is a side elevation cross-sectional view of an embodiment of a transducer system.

According to embodiments herein, a system and method are provided to facilitate the reconnection of all ground electrodes after dicing a transducer assembly. FIG. 2 shows a side elevation cross-sectional view of a transducer assembly 32. The transducer assembly 32 can include a block of piezoelectric material 34, which is partly covered by a plating material 36 wrapped therearound. Two elongated parallel deactivation cuts 38 are made along a surface of the plating material 36 to define a positive electrode 40 and a ground electrode 42. The deactivation cuts 38 extend proximate to and parallel to side walls 44 of the block of piezoelectric material 34. The deactivation cuts 38 extend into and out of the page in FIG. 2.

The positive electrode 40 can be formed by the portion of the plating material 36 that is disposed between the two deactivation cuts 38. A ground electrode 42 can be formed by the portion of the plating material 36 that is disposed outside of the two deactivation cuts 38. The ground electrode 42 can extend about a portion of an upper side 46 of the piezoelectric material 34, over the side walls 44 and across a lower side 48 of the piezoelectric material 34. The terms "upper" and "lower" are used for convenience to facilitate the discussion and are not meant to be limiting. Indeed, the operational position of sides 46, 48 can vary depending on the application at hand. The block of piezoelectric material 34 and the plating material 36 with the deactivation cuts 38 can form a piezoelectric material/electrode subassembly 52.

A circuit 70 is disposed on the piezoelectric material/electrode subassembly 52. As will be explained in greater detail below, electrical connections can be made between the circuit 70 and the positive and ground electrodes 40, 42 in locations of each intended transducer element. As will be explained later, a plurality of transducer element can be formed by a series of cuts made in the piezoelectric material/electrode subassembly 52. A solid backer 50 may be attached to the upper side 46 of the piezoelectric material/electrode subassembly 52 with the circuit 70 sandwiched therebetween. One or more matching layers 54 can then attached to the lower side 48 of the piezoelectric material/electrode subassembly 52.

As noted above, the transducer assembly 32 can include a circuit 70. In one embodiment, the circuit 70 can be a flexible circuit 72. The circuit 70 can have a plurality of layers, which will be described in turn below. The circuit 70 can have an associated axial direction A, a longitudinal direction L that is transverse to the axial direction A, and a thickness direction T. In FIG. 2, the axial direction A extends into and out of the page.

The circuit 70 can include a first layer 74. In the transducer assembly 32, a portion of the first layer 74 can be substantially adjacent to the positive electrode 40 and the ground electrode 42 on the upper side 46 of the piezoelectric material/plating material assembly 52. "Substantially adjacent" means direct physical abutment or a slight spacing therebetween in at least some places. The circuit 70 can include a second layer 76 and a third layer 78. The second layer 76 can be between the first and third layers 74, 78. One side of the second layer 76 can be substantially adjacent to the first layer 74, and the other side of the second layer 76 can be substantially adjacent to the third layer 78.

A plurality of vias can extend within at least a portion of the circuit 70. The term "via" means any suitable element for establishing electrical connection between conductors in different layers within the circuit and/or with one or more conductors external to the circuit. Any suitable type of via can be used. In one embodiment, the vias can be pads with plated holes, which can be made to be conductive by electroplating, or the holes can be filled with annular rings or rivets. Embodiments are not limited to any particular type of via.

One or more of the vias can extend substantially parallel to the thickness direction T, or one or more of the vias can extend at an angle relative to the thickness direction T. The vias can be substantially straight, or at least one of the vias can include one or more non-straight features along its length.

Figure 3:
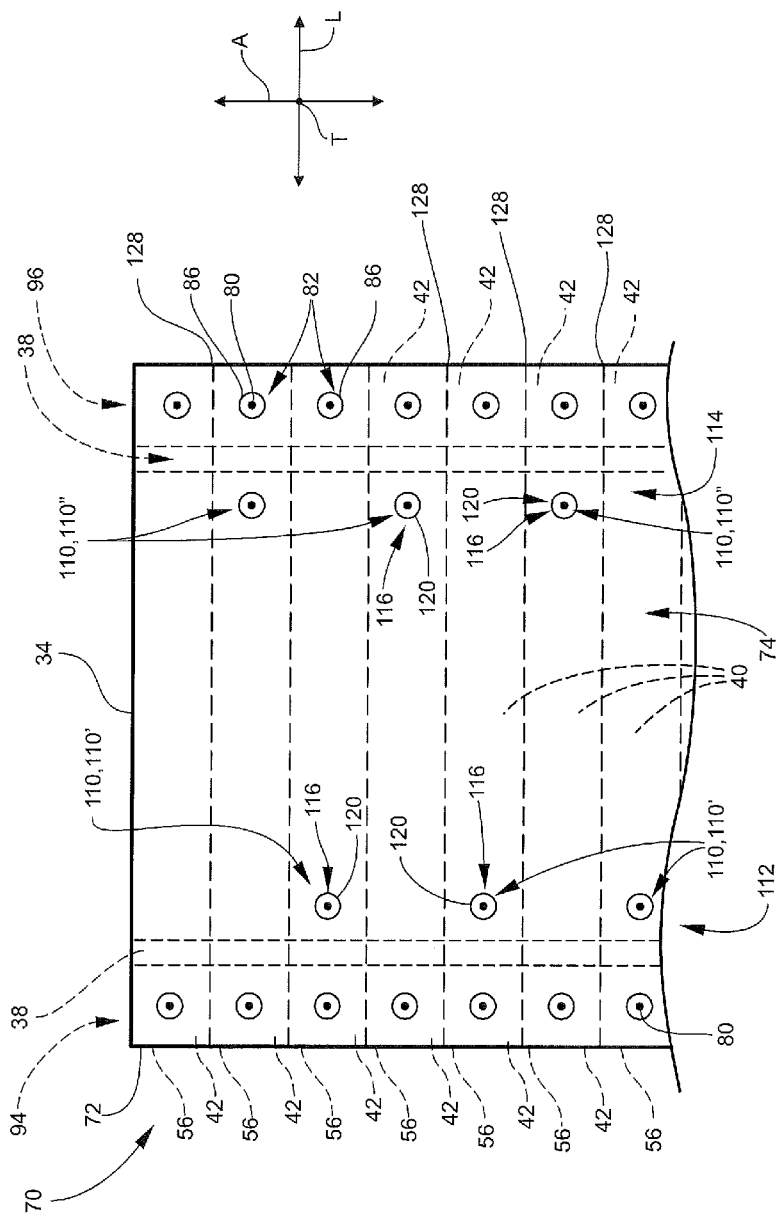
FIG. 3 is a top plan cross-sectional view of a first layer of an embodiment of a circuit, viewed along line 3-3 in FIG. 2.

FIG. 3 is a top plan cross-sectional view of the first layer 74 the circuit 70, as viewed in the direction of the arrows associated with line 3-3 in FIG. 2. The deactivation cuts 38 would not be seen in this view, but they are shown in dashed lines for reference. A plurality of first vias 80 can extend through the first layer 74, through the second layer 76 and into the third layer 78. The plurality of first vias 80 can be formed in the circuit 70 such that each of the first vias 80 can be outboard of the deactivation cuts 38. In other words, each of the plurality of first vias 80 can be aligned with a respective one of the ground electrodes 42 when the circuit 70 is disposed on the piezoelectric material/plating material assembly 52, as is shown in FIG. 3

There can be at least two first vias 80 associated with each transducer element 56. For example, one of the first vias 80 can be associated with a first longitudinal end portion 94 of the ground electrode 42, and another one of the first vias 80 can be associated with a second longitudinal end portion 96 of the ground electrode 42. The first vias 80 can be substantially aligned in the axial direction A along the first and second longitudinal end portions 94, 96 of the ground electrodes 42, as is shown in FIG. 3. While not shown in FIG. 3, one or more of the first vias 80 can be offset from the other first vias 80 in the axial direction A.

Figure 5:
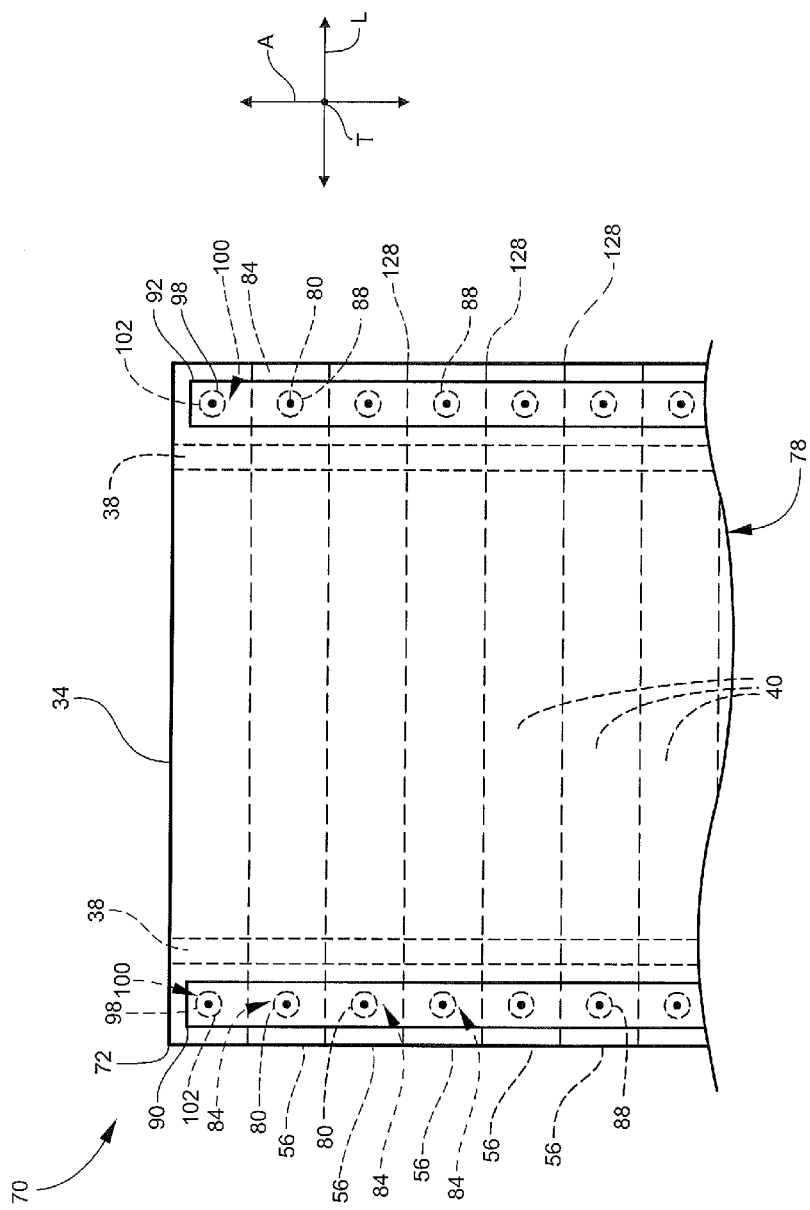
FIG. 5 is a top plan cross-sectional view of a third layer of an embodiment of a circuit, viewed along line 5-5 in FIG. 2.

Each of the plurality of first vias 80 can have a first end 82 (see FIGS. 2-3) and a second end 84 (see FIGS. 2 and 5). The first end 82 of each of the first vias 80 can be exposed outside the circuit 70 for connection to a respective ground electrode 42 of one of the transducer elements 56. The first end 82 of the first vias 80 can be adapted to facilitate operative connection to the ground electrodes 42. For example, the first end 82 of the first vias 80 can include connection pads 86 (see FIG. 3). The second end 84 of the first vias 80 can terminate within or external to the third layer 78. The second end 84 of the first vias 80 can be adapted to facilitate operative connection to these another item, such as one or more of grounds in the third later 78. For example, the second end 84 of the first vias 80 can include connection pads 88 (FIG. 5).

FIG. 5 is a top plan cross-sectional view of the third layer 78 of the circuit 70, as viewed in the direction of the arrows associated with line 5-5 in FIG. 2. The deactivation cuts 38 and cuts 128 would not be seen in this view, but they are shown in dashed lines for reference. The third layer 78 can include one or more different traces, including, for example, a first ground 90 and a second ground 92. The first and second grounds 90, 92 can provide a common return path for signals in the circuit 70. The first and second grounds 90, 92 can be elongated conductors. The first and second grounds 90, 92 can be made of any suitable material. The first and second grounds 90, 92 can be any suitable size or shape. The first and second grounds 90, 92 can be substantially parallel to each other. The first and second grounds 90, 92 can extend in generally the axial direction A. The second end 84 of each of the first vias 80 can be operatively connected to a respective one of the grounds 90, 92. The term "operatively connected," as used herein, can include direct and indirect connections.

Some of the plurality of first vias 80 can be united at the first ground 90, and some of the plurality of first vias 80 can be united at the second ground 92. The first and second grounds 90, 92 can be taken outside the circuit 70. To that end, there can be a ground via 98 associated with each of the grounds 90, 92 (see FIG. 5). The ground vias 98 are different from the first vias 80. For instance, as will be explained in more detail below, the first vias 80 operatively connect the ground electrodes 42 to a respective one of the grounds 90, 92 whereas, as will be explained below, the ground vias 98 operatively connect one of the grounds 90, 92 and to a conductor extending outside of the circuit 70.

The ground via 98 can be operatively connected at a first end 100 to a respective ground 90, 92. The first end 100 may include a connection pad 102 or other suitable structure to facilitate operative connection. The ground via 98 can extend from the third layer 78 and into the second layer 76.

Figure 4:
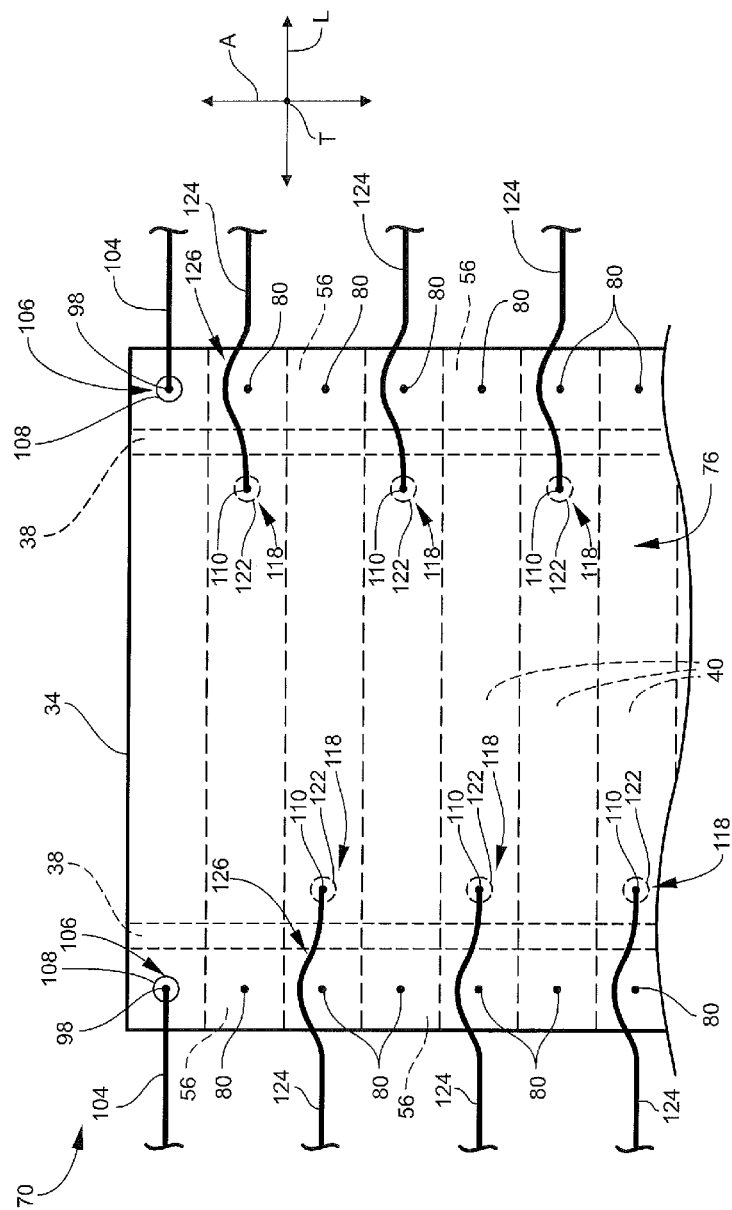
FIG. 4 is a top plan cross-sectional view of a second layer of an embodiment of a circuit, viewed along line 4-4 in FIG. 2.

FIG. 4 is a top plan cross-sectional view of the second layer 76 of the circuit 70, as viewed in the direction of the arrows associated with line 4-4 in FIG. 2. The deactivation cuts 38 would not be seen in this view, but they are shown in dashed lines for reference. In the second layer 76, a conductor 104 can be operatively connected to a second end 106 of the ground via 98. The second end 106 may include a connection pad 108 or other suitable structure to facilitate operative connection. The conductor 104 can extend generally in the longitudinal direction L within the second layer 76 to outside the circuit 70. The conductor 104 can be operatively connected to a cable assembly (not shown) that can carry electrical signals to an ultrasound system (not shown).

The circuit 70 can include a plurality of second vias 110. The plurality of second vias 110 can extend from the first layer 74 of the circuit 70 and into a depth in the second layer 76 (see FIG. 2). The plurality of second vias 110 can be provided such that each second via 110 can be aligned with a respective one of the transducer elements 56 (see FIGS. 3-4). Each of the plurality of second vias 110 can be inboard of the deactivation cuts 38. Thus, each of the second vias 110 can be in line with a respective one of the positive electrodes 40 when the circuit 70 is disposed on the piezoelectric material/plating material assembly 52, as is shown in FIG. 3.

The plurality of second vias 110 can be distributed in any suitable manner. In one embodiment, the plurality of second vias 110 can be provided in a staggered arrangement. That is, a first subset 110' of the second vias 110 can alternate with a second subset 110" of the second vias 110, as is shown in FIG. 3. Each of the second vias 110 in the first subset 110' can be provided proximate to a first longitudinal end 112 of the positive electrode 40 of a respective one of the transducer elements 56. Each of the second vias 110 in the second subset 110" can be provided proximate to a second longitudinal end 114 of the positive electrode 40 of a respective one of the respective transducer elements 56. Such a staggered arrangement can be convenient for avoiding overcrowding of individual traces from the circuit 70.

However, embodiments are not limited to an arrangement in which the plurality of second vias 110 is staggered. For instance, the second plurality of vias 110 can be substantially aligned in the axial direction A. Thus, it will be appreciated that the plurality of second vias 110 can be provided in any suitable location and arranged in any suitable manners on the transducer elements 56.

Each of the plurality of second vias 110 can have a first end 116 (see FIGS. 2-3) and a second end 118 (see FIGS. 2 and 4). The first end 116 of the second vias 110 can be at least partially exposed outside the circuit 70. The first end 116 of the plurality of second vias 110 can include connection pads 120 (FIG. 3) and/or other features to facilitate operative connection to another item, such as one of the positive electrodes 40.

The second end 118 (see FIG. 4) of the plurality of second vias 110 can terminate within the second layer 76. The second end 118 of the plurality of second vias can include connection pads 122 (FIG. 4) and/or other features to facilitate operative connection to another item. For instance, a conductor 124 can be operatively connected to the second end 118 of each second via 110. The conductors 124 can extend generally in the longitudinal direction L within the second layer 76, as is shown in FIG. 4. Each conductor 124 can include a jog portion 126 that extends around the first via 80 on the same transducer element 56 to prevent a short. The jog portion 126 can have any suitable configuration so long as the conductor 124 avoids contact with the first vias 80. The conductors 124 can be operatively connected to a cable assembly (not shown) that can carry electrical signals to an ultrasound system (not shown).

It may be beneficial to configure the vias to minimize problems that would be caused if one or more of the vias 80, 98, 110 were to break or malfunction. For example, redundancy can be introduced into the system so that additional vias are provided in at least some locations. To that end, at least some of the vias 80, 98 and/or 110 can be provided in pairs or in triplets. An example of an arrangement in which pairs of vias are provided is shown in FIG. 6.

Now that the details of the circuit have been described, one manner of assembling a transducer having such a circuit will now be described. It will be understood that the following description is provided as only an example, and embodiments are not limited to any particular method of assembly.

The piezoelectric material/electrode subassembly 52 can be formed in any suitable manner, including in any conventional manner. Likewise, one or more matching layers 54 (FIG. 2) can be attached to one side of the piezoelectric material/electrode subassembly 52 in any suitable manner. The one or more matching layers 54 can minimize acoustic mismatches between transducer elements 56, which typically have very large acoustic impedance, and the body of a patient being imaged, which has low acoustic impedance. As a result, the matching layers 54 can improve acoustic energy transmission efficiency.

The circuit 70 can be brought into engagement with the other side of the piezoelectric material/electrode subassembly 52. The first end 82 of each first via 80 can be operatively connected to the positive electrode 40 in any suitable manner. For instance, the first end 82 of each first via 80 can be operatively connected to the positive electrode 40 by epoxy or other suitable adhesive and/or by physical engagement between the first vias 80 and the positive electrode 40. The first end 116 of each second via 110 can be operatively connected to the ground electrode 42. A backer 50 can be attached to the piezoelectric material/electrode subassembly 52 such that the circuit 70 is sandwiched therebetween. The backer 50 can provide structural integrity to the transducer assembly 32.

A plurality of individual transducer elements 56 are formed by making a plurality of parallel dices or cuts 128 in the transducer assembly 32, as shown in FIGS. 3-4. Such cuts can be formed using a dicing saw (not shown) or other suitable cutting device. The dicing saw can be brought into contact with the assembly from the patient side of the assembly 32, that is, from the matching layer 54 side of the assembly. Thus, the dicing saw can cut through the one or more matching layers 54, through the plating material 36, through the piezoelectric material 34, and into the circuit 70. The dicing saw can penetrate the first and second layers 74, 76 of the circuit 70, but the saw does not cut into the third layer 78. After the dicing operation, kerf filler (not shown) can be placed in the cuts 128 to provide structural support to the diced assembly.

Significantly, because no cuts are made in the third layer 78 of the circuit 70, a common ground connection is maintained by way of the grounds 90, 92. Thus, no subsequent operation of reconnecting the common ground electrode 42 is required. As a result, there can be appreciable time and labor savings in the process of forming the transducer assembly 32.

Examples have been described above regarding a transducer assembly and method of manufacturing the same. Thus, it will of course be understood that embodiments are not limited to the specific details described herein, which are given by way of example only, and that various modifications and alterations are possible within the scope of the following claims.

What is claimed is:

1. An ultrasonic transducer system comprising:
   a plurality of piezoelectric elements partially covered by a plating material wrapped around each piezoelectric element, two elongated parallel deactivation cuts being formed in a surface of the plating material so as to define a positive electrode and a ground electrode; and
   a circuit having a first layer, a second layer, and a third layer, a first ground and a second ground being provided in the third layer, and a plurality of first vias, each first via having a first end and a second end, the second end of each first via being operatively connected to a respective one of the first and second grounds, the first vias extending from the first and second grounds such that the first vias pass through the first and second layers, the first end of each first via being operatively connected to the ground electrode of a respective one of the plurality of piezoelectric elements.

2. The ultrasonic transducer system of claim 1 wherein the first vias are provided in pairs.

3. The ultrasonic transducer system of claim 1 wherein the circuit is a flexible circuit.

4. The ultrasonic transducer system of claim 1 further including:
   a ground via operatively connected at one end to one of the first ground or the second ground, the ground via extending therefrom to the second layer; and a conductor operatively connected to the ground via.

5. The ultrasonic transducer system of claim 1 further including:
   a plurality of second vias, each second via having a first end and a second end, the first end of each second via being operatively connected to the positive electrode of a respective one of the plurality of piezoelectric elements, the second end of each second via being located within the second layer.

6. The ultrasonic transducer system of claim 5 wherein the plurality of second vias is located inboard on the plurality of first vias.

7. The ultrasonic transducer system of claim 5 further including a plurality of conductors, each conductor being operatively connected to a respective one of the second ends of the second vias.

8. The ultrasonic transducer system of claim 5 wherein the plurality of second vias are arranged in a staggered manner.

9. The ultrasonic transducer system of claim 5 wherein the plurality of second vias are provided in pairs.

* * * * *